US012557688B2

(12) United States Patent
Fang (10) Patent No.: US 12,557,688 B2
(45) Date of Patent: Feb. 17, 2026

(54) METHOD OF MANUFACTURING SEMICONDUCTOR DEVICE

(71) Applicant: NANYA TECHNOLOGY CORPORATION, New Taipei (TW)

(72) Inventor: Wei-Chuan Fang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 447 days.

(21) Appl. No.: 18/304,367

(22) Filed: Apr. 21, 2023

(65) Prior Publication Data

US 2024/0355642 A1    Oct. 24, 2024

(51) Int. Cl.
| | |
|---|---|
| *H01L 21/56* | (2006.01) |
| *H01L 21/02* | (2006.01) |
| *H01L 21/311* | (2006.01) |
| *H01L 21/3213* | (2006.01) |

(52) U.S. Cl.
CPC .......... *H01L 21/56* (2013.01); *H01L 21/0217* (2013.01); *H01L 21/02211* (2013.01); *H01L 21/02274* (2013.01); *H01L 21/31111* (2013.01); *H01L 21/32133* (2013.01)

(58) Field of Classification Search
CPC ....... H01L 25/13; H01L 27/156; H01L 33/06; H01L 33/145; H01L 33/46; H01L 33/50; H01L 33/60; H01L 33/62; B60K 35/00; G06F 1/163
See application file for complete search history.

(56) References Cited

U.S. PATENT DOCUMENTS

| | | | |
|---|---|---|---|
| 2019/0326313 A1* | 10/2019 | Cui | H10B 43/35 |
| 2023/0378255 A1* | 11/2023 | Wu | H10D 84/038 |
| 2024/0379416 A1* | 11/2024 | Lo | H01L 21/76831 |

OTHER PUBLICATIONS ip.com search history attached. (Year: 2025).*
Z. Yin et al., "Effects of Hydrogen in Passivation PECVD Nitride Film on DRAM Refresh Performance", 0-7803-8369-9/04, P114~116, IEEE, Year2004.

* cited by examiner

*Primary Examiner* — Zandra V Smith
*Assistant Examiner* — Andre C Stevenson
(74) *Attorney, Agent, or Firm* — CKC & Partners Co., LLC (57) ABSTRACT

The present disclosure provides a method of manufacturing a semiconductor device. The method includes: providing a semiconductor structure, in which the semiconductor structure includes alternatively disposed first nitride portions and second nitride portions wrapping portions of an oxide layer, a dielectric layer disposed between one of the first nitride portions and one of the second nitride portions, a top nitride surrounded by the one of the first nitride portions or the one of the second nitride portions, a filling material, and a cap layer disposed on the filling material; forming a plurality of trenches to expose the portions of the oxide layer wrapped by the first nitride portions and the second nitride portions; forming air gaps by removing the portions of the oxide layer; and conformally forming an encapsulating layer on inner sidewalls of the trenches to encapsulate the air gaps.

10 Claims, 6 Drawing Sheets

METHOD OF MANUFACTURING SEMICONDUCTOR DEVICE

BACKGROUND

Field of Invention

The present disclosure relates to a method of manufacturing a semiconductor device.

Description of Related Art

With the evolution of generations of semiconductor processes, there will be challenges of a semiconductor structure in a memory device. One of the related challenges is that the parasitic capacitance of the semiconductor device will be increased if air gaps are not encapsulated in a proper manner (for instance, the air gaps are filled) during an air gap encapsulation process. The other one of the related challenges is that defects may occur during the process of filling the trench located over the air gaps if the trench is not filled in a proper manner. The defects are likely to cause resistance variation and a decrease in the breakdown voltage in subsequent related processes, thereby reducing the performance of the entire semiconductor device.

SUMMARY

In view of this, one purpose of present disclosure is to provide a method of manufacturing a semiconductor device that can solve the aforementioned problems.

In order to achieve the above objective, according to an embodiment of the present disclosure, a method of manufacturing a semiconductor device includes: providing a semiconductor structure, in which the semiconductor structure includes alternatively disposed first nitride portions and second nitride portions wrapping portions of an oxide layer, a dielectric layer disposed between one of the first nitride portions and one of the second nitride portions, a top nitride surrounded by the one of the first nitride portions or the one of the second nitride portions, a filling material disposed over the dielectric layer, the first nitride portions, the second nitride portions, and the top nitride, and a cap layer disposed on the filling material; forming a plurality of trenches to expose the portions of the oxide layer wrapped by the first nitride portions and the second nitride portions, in which the trenches at least run through the filling material and the cap layer; forming air gaps by removing the portions of the oxide layer wrapped by the first nitride portions and the second nitride portions; and conformally forming an encapsulating layer on inner sidewalls of the trenches to encapsulate the air gaps, in which the encapsulating layer includes accumulating portions around a top of the trenches, and in which the encapsulating layer is formed with a deposition rate less than 30 angstroms per second (Å/sec).

In one or more embodiments of the present disclosure, the deposition rate is in a range between 5 angstroms per second and 20 angstroms per second.

In one or more embodiments of the present disclosure, conformally forming the encapsulating layer on the inner sidewalls of the trenches is performed by using a first hydrogen-containing gas and a second hydrogen-containing deposition gas different from the first hydrogen-containing gas.

In one or more embodiments of the present disclosure, the first hydrogen-containing gas is silane ($SiH_4$), and the second hydrogen-containing deposition gas is gaseous ammonia ($NH_3$).

In one or more embodiments of the present disclosure, conformally forming the encapsulating layer on the inner sidewalls of the trenches is performed by supplying the first hydrogen-containing gas with a first flowrate greater than 200 standard cubic centimeters per minute (sccm), and supplying the second hydrogen-containing deposition gas with a second flowrate greater than 500 sccm.

In one or more embodiments of the present disclosure, the first flowrate is in a range between 210 sccm and 270 sccm, and the second flowrate is in a range between 2900 sccm and 3500 sccm.

In one or more embodiments of the present disclosure, forming the air gaps by removing the portions of the oxide layer wrapped by the first nitride portions and the second nitride portions is performed by using hydrofluoric acid.

In one or more embodiments of the present disclosure, forming the trenches is performed such that a portion of the first nitride portions and a portion of the second nitride portions are removed.

In one or more embodiments of the present disclosure, the encapsulating layer is composed of nitride.

In one or more embodiments of the present disclosure, conformally forming the encapsulating layer on the inner sidewalls of the trenches is performed by a plasma-enhanced chemical vapor deposition (PECVD) process.

In order to achieve the above objective, according to an embodiment of the present disclosure, a method of manufacturing a semiconductor device includes: providing a semiconductor structure, in which the semiconductor structure includes alternatively disposed first nitride portions and second nitride portions wrapping portions of an oxide layer, a dielectric layer disposed between one of the first nitride portions and one of the second nitride portions, a top nitride surrounded by the one of the first nitride portions or the one of the second nitride portions, a filling material disposed over the dielectric layer, the first nitride portions, the second nitride portions, and the top nitride, and a cap layer disposed on the filling material; forming a plurality of trenches to expose the portions of the oxide layer wrapped by the first nitride portions and the second nitride portions, in which the trenches at least run through the filling material and the cap layer; removing the portions of the oxide layer wrapped by the first nitride portions and the second nitride portions to form air gaps; and conformally forming an encapsulating layer on inner sidewalls of the trenches to encapsulate the air gaps, in which the encapsulating layer includes accumulating portions around a top of the trenches, and in which the encapsulating layer is formed by using a first hydrogen-containing gas and a second hydrogen-containing deposition gas different from the first hydrogen-containing gas, and in which the encapsulating layer partially fills the air gaps.

In one or more embodiments of the present disclosure, the first hydrogen-containing gas is silane ($SiH_4$), and the second hydrogen-containing deposition gas is gaseous ammonia ($NH_3$).

In one or more embodiments of the present disclosure, conformally forming the encapsulating layer on the inner sidewalls of the trenches is performed by supplying the first hydrogen-containing gas with a first flowrate greater than 200 standard cubic centimeters per minute (sccm), and supplying the second hydrogen-containing deposition gas with a second flowrate greater than 500 sccm.

In one or more embodiments of the present disclosure, the first flowrate is in a range between 210 sccm and 270 sccm, and the second flowrate is in a range between 2900 sccm and 3500 sccm.

In one or more embodiments of the present disclosure, conformally forming the encapsulating layer on the inner sidewalls of the trenches is performed with a deposition rate less than 30 angstroms per second (Å/sec).

In one or more embodiments of the present disclosure, the deposition rate is in a range between 5 angstroms per second and 20 angstroms per second.

In one or more embodiments of the present disclosure, conformally forming the encapsulating layer on the inner sidewalls of the trenches is performed such that the air gaps of the first nitride portions and the air gaps of the second nitride portions are encapsulated.

In one or more embodiments of the present disclosure, forming the trenches is performed such that a portion of the first nitride portions and a portion of the second nitride portions are removed.

In one or more embodiments of the present disclosure, forming the trenches is performed such that the air gaps of the first nitride portions and the air gaps of the second nitride portions respectively communicate with the trenches.

In one or more embodiments of the present disclosure, removing the portions of the oxide layer wrapped by the first nitride portions and the second nitride portions is performed by using hydrofluoric acid.

In summary, the method of manufacturing the semiconductor device of the present disclosure provides superior gap-fill capability without extraordinary impurity penetration. In the method of manufacturing the semiconductor device of the present disclosure, since the encapsulating layer is deposited with an extremely low deposition rate, the air gaps are well encapsulated by the encapsulating layer, thereby reducing the parasitic capacitance of the semiconductor device. In the method of manufacturing the semiconductor device of the present disclosure, since the encapsulating layer is deposited using hydrogen-containing deposition gases, the sufficient hydrogen generated during the process terminates the dangling bonds distributed on the surface of the semiconductor device, thereby improving the electrical performance of the entire semiconductor device.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Figure 1:
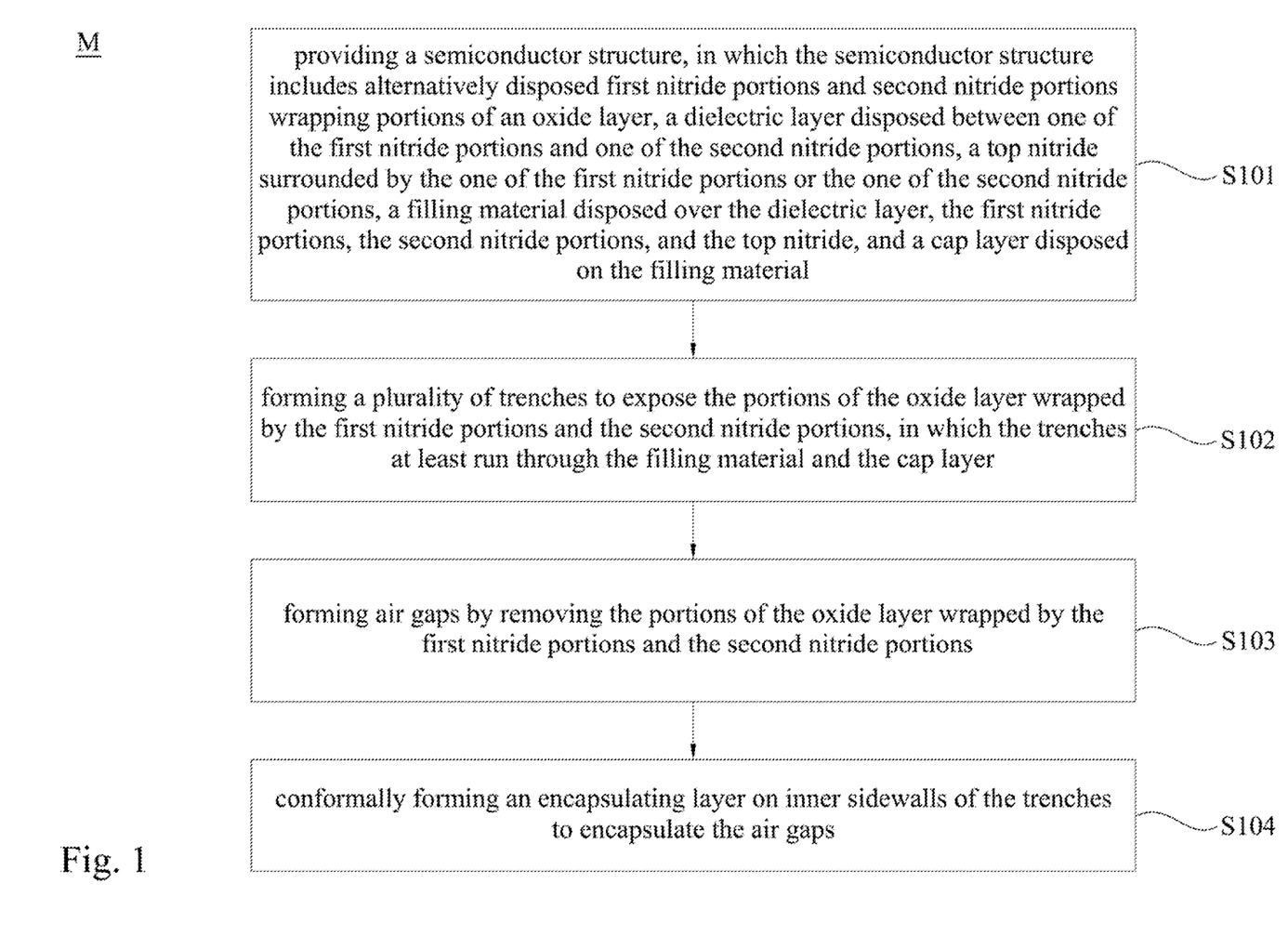
FIG. 1 is a flow chart of a method of manufacturing a semiconductor device in accordance with an embodiment of present disclosure.
Figure 4:
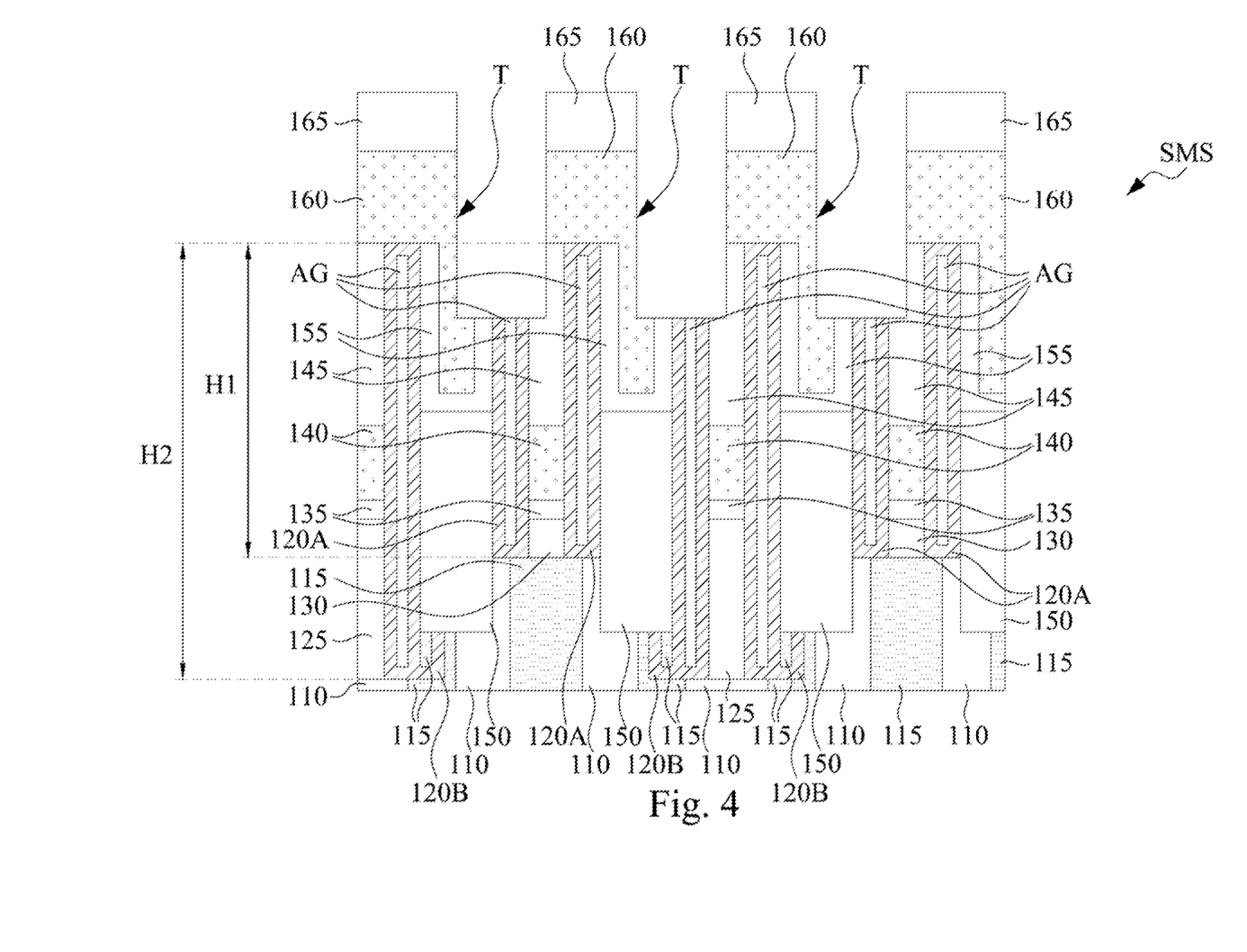
FIG. 4 is a cross-sectional view of an intermediate stage of manufacturing the semiconductor device in accordance with an embodiment of present disclosure.
Figure 5:
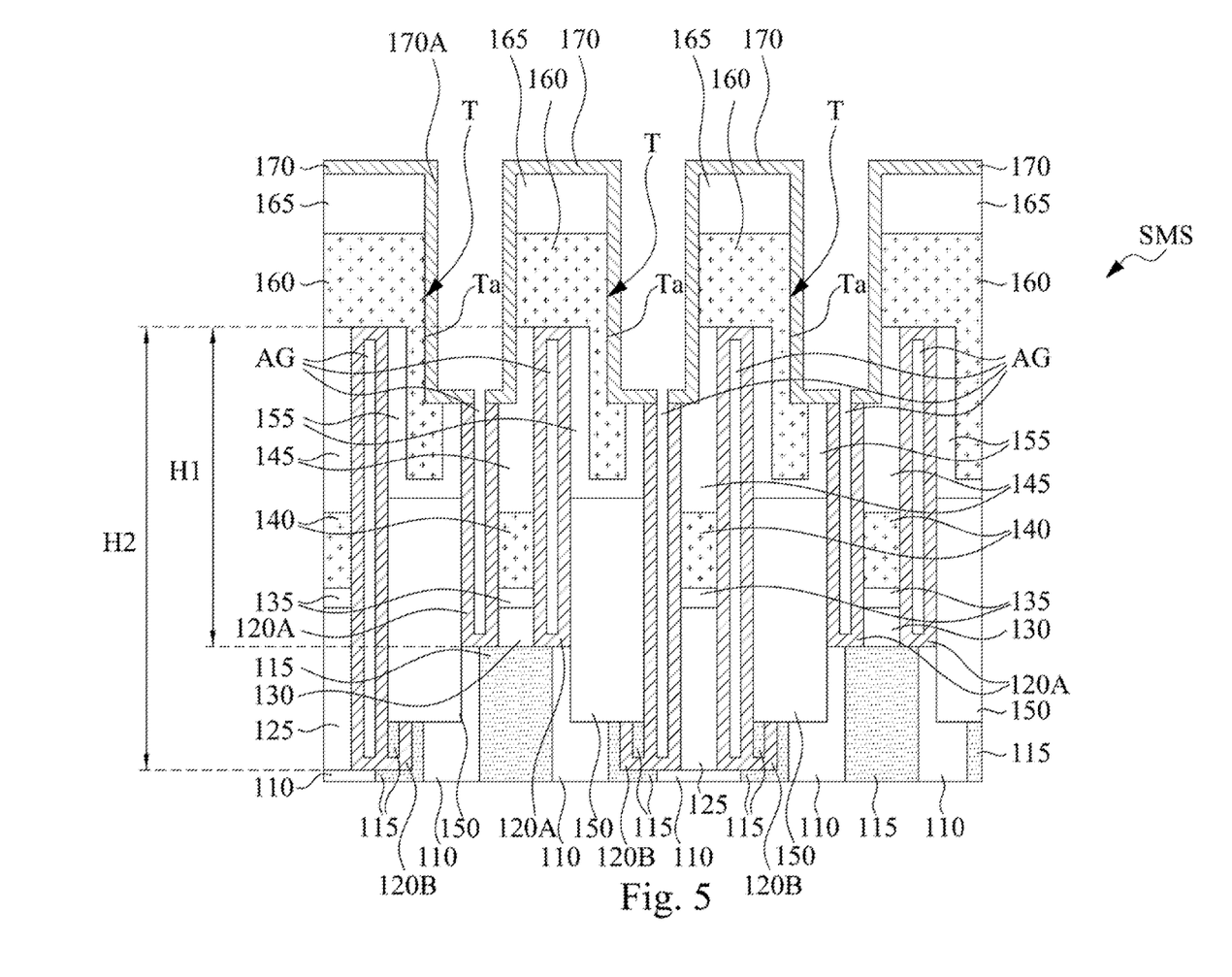
FIG. 5 is a cross-sectional view of an intermediate stage of manufacturing the semiconductor device in accordance with an embodiment of present disclosure.

Reference is made to FIG. 1. FIG. 1 is a flow chart of a method M of manufacturing a semiconductor device 100 as shown in FIG. 5 in accordance with an embodiment of present disclosure. The method M shown in FIG. 1 includes a step S101, a step S102, a step S103, and a step S104. Please refer to FIG. 1 and FIG. 2 for better understanding the step S101, refer to FIG. 1 and FIG. 3 for better understanding the step S102, refer to FIG. 1 and FIG. 4 for better understanding the step S103, and refer to FIG. 1, FIG. 5 and FIG. 6 for better understanding the step S104.

Step S101, step S102, step S103, and step S104 are described in detail below.

Figure 2:
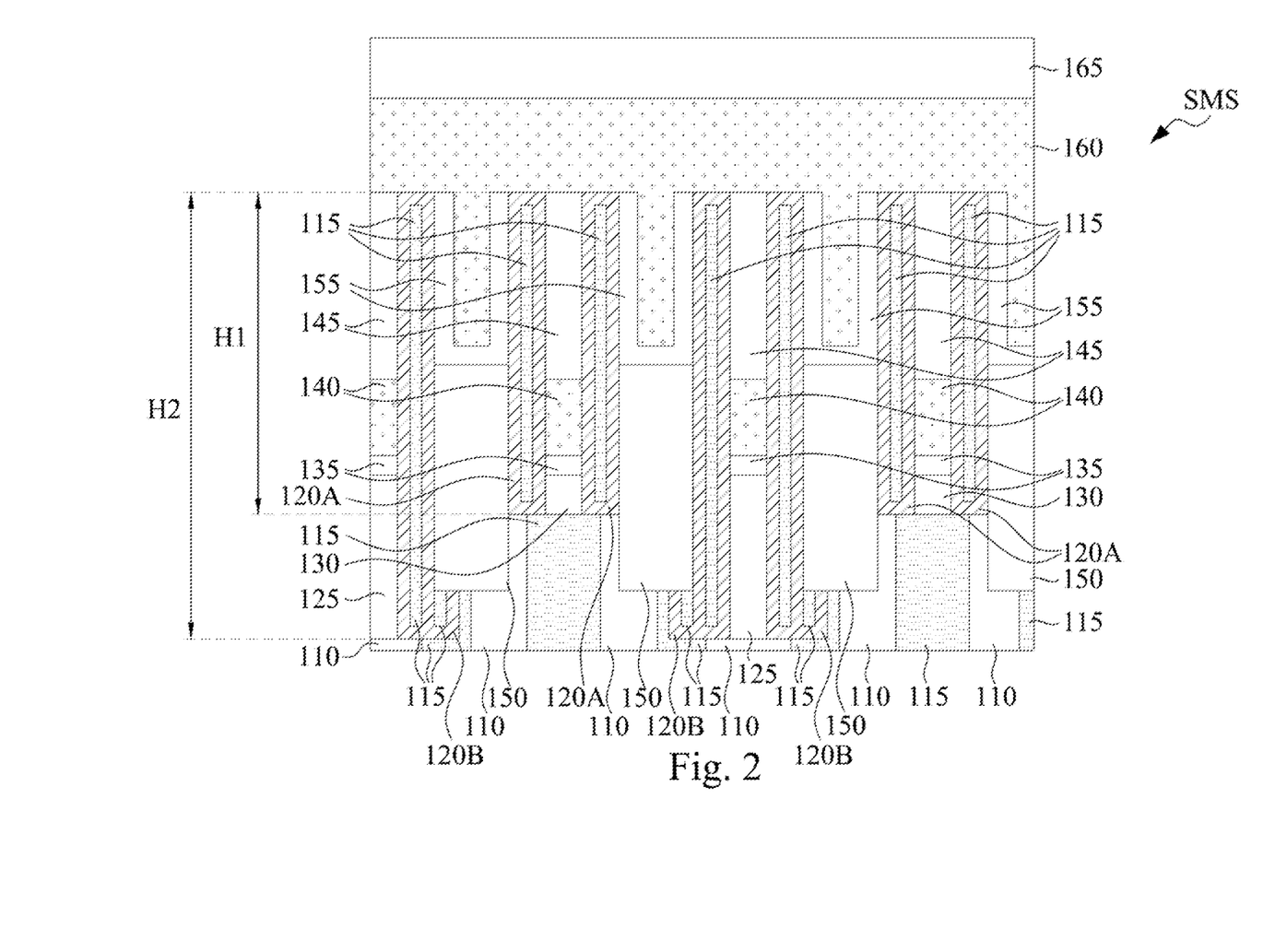
FIG. 2 is a cross-sectional view of an intermediate stage of manufacturing a semiconductor device in accordance with an embodiment of present disclosure.

In step S101, a semiconductor structure SMS is provided, as shown in FIG. 2.

Reference is made to FIG. 2. FIG. 2 is a cross-sectional view of an intermediate stage of manufacturing the semiconductor device 100 in accordance with an embodiment of present disclosure. As shown in FIG. 2, the semiconductor structure SMS includes a substrate 110 and an oxide layer 115 on the substrate 110. In some embodiments, the substrate 110 may be an active region (for example, a source/drain region). In some embodiments, the oxide layer 115 is configured as shallow trench isolation (STI). As shown in FIG. 2, the semiconductor structure SMS further includes a plurality of first nitride portions 120A and a plurality of second nitride portions 120B. The first nitride portions 120A and the second nitride portions 120B at least protrude from the substrate 110. As shown in FIG. 2, the first nitride portions 120A and the second nitride portions 120B include portions of the oxide layer 115 therein. In some embodiments, the first nitride portions 120A and the second nitride portions 120B respectively wrap (or encapsulate) the portions of the oxide layer 115, as shown in FIG. 2.

Reference is made again to FIG. 2. The semiconductor structure SMS further includes a contact 125 and a bottom nitride 130. The contact 125 is surrounded by one of the second nitride portions 120B, and the bottom nitride 130 is surrounded by one of the first nitride portions 120A, as shown in FIG. 2. The contact 125 is connected to the substrate 110, and the bottom nitride 130 is connected to the oxide layer 115. In some embodiments, the contact 125 is configured as an ohmic contact. The semiconductor structure SMS further includes an intermediate nitride 135, a first conductive material 140, and a top nitride 145. The intermediate nitride 135 is disposed on the bottom nitride 130 and is surrounded by the first nitride portions 120A. The intermediate nitride 135 is disposed on the contact 125 and surrounded by the second nitride portions 120B. The first conductive material 140 is disposed on the intermediate nitride 135 and surrounded by the first nitride portions 120A or the second nitride portions 120B. The top nitride 145 is disposed on the first conductive material 140 and is surrounded by the first nitride portions 120A or the second nitride portions 120B.

Reference is made again to FIG. 2. The semiconductor structure SMS further includes a second conductive material 150 and a dielectric layer 155. The second conductive material 150 is contact with the substrate 110 and the oxide layer 115. The second conductive material 150 is disposed between the first nitride portions 120A and the second nitride portions 120B. In some embodiments, the second conductive material 150 is configured as an ohmic contact. The dielectric layer 155 is disposed on the second conductive material 150 and disposed between the one of the first nitride portions 120A and the one of the second nitride portions 120B. The semiconductor structure SMS further includes a filling material 160 and a cap layer 165. The filling material 160 is disposed over the dielectric layer 155. In some embodiments, the filling material 160 fills a concave portion defined by the dielectric layer 155. The cap layer 165 is disposed on the filling material 160.

In some embodiments, the first nitride portions 120A and the second nitride portions 120B are elongated in a direction from the substrate 110 to the top nitride 145 (for example, elongated in a bottom-up direction of FIG. 2).

In some embodiments, the first nitride portions 120A has a height H1 from a top surface of the oxide layer 115 to a top surface of the top nitride 145 in the cross-sectional view of FIG. 2, the second nitride portions 120B has a height H2 from the substrate 110 to the top surface of the top nitride 145 in the cross-sectional view of FIG. 2. In some embodiments, a top of the first nitride portions 120A and a top of the second nitride portions 120B are co-planar. In some embodiments, the height H1 is less than the height H2.

In some embodiments, the substrate 110 may be composed of silicon-based material. In some embodiments, the substrate 110 may include a material, such as polysilicon, monocrystalline silicon, amorphous silicon, or the like. However, any suitable material may be utilized.

In some embodiments, the substrate 110 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the substrate 110.

In some embodiments, the oxide layer 115 may be composed of oxide. In some embodiments, the oxide layer 115 may include a material, such as silicon oxide ($SiO_2$), or the like. However, any suitable material may be utilized.

In some embodiments, the oxide layer 115 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the oxide layer 115.

In some embodiments, the first nitride portion 120A and the second nitride portion 120B may be composed of nitride. In some embodiments, the first nitride portion 120A and the second nitride portion 120B may include a material, such as titanium nitride (TiN), silicon nitride ($Si_xN_y$), or the like. However, any suitable material may be utilized.

In some embodiments, the first nitride portion 120A and the second nitride portion 120B may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the first nitride portion 120A and the second nitride portion 120B.

In some embodiments, the contact 125 may include a material, such as titanium nitride (TiN), or the like. However, any suitable material may be utilized.

In some embodiments, the contact 125 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the contact 125.

In some embodiments, the bottom nitride 130 may be composed of nitride. In some embodiments, the bottom nitride 130 may include a material, such as titanium nitride (TiN), silicon nitride ($Si_xN_y$), or the like. However, any suitable material may be utilized.

In some embodiments, the bottom nitride 130 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the bottom nitride 130.

In some embodiments, the intermediate nitride 135 may be composed of nitride. In some embodiments, the intermediate nitride 135 may include a material, such as titanium nitride (TiN), or the like. However, any suitable material may be utilized.

In some embodiments, the intermediate nitride 135 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the intermediate nitride 135.

In some embodiments, the first conductive material 140 may be composed of metallic material. In some embodiments, the first conductive material 140 may include a material, such as tungsten (W), or the like. However, any suitable material may be utilized.

In some embodiments, the first conductive material 140 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the first conductive material 140.

In some embodiments, the top nitride 145 may be composed of nitride. In some embodiments, the top nitride 145 may include a material, such as silicon nitride (SixNy), or the like. However, any suitable material may be utilized.

In some embodiments, the top nitride 145 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the top nitride 145.

In some embodiments, the second conductive material 150 may include a material, such as polysilicon, or the like. However, any suitable material may be utilized.

In some embodiments, the second conductive material 150 may be ohmic contact. In some embodiments, the second conductive material 150 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the second conductive material 150.

In some embodiments, the dielectric layer 155 may be spin-on dielectric. In some embodiments, the dielectric layer 155 may include a material, such as titanium nitride (TiN), silicon nitride ($SiO_2$), or the like. However, any suitable material may be utilized.

In some embodiments, the dielectric layer 155 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the dielectric layer 155.

In some embodiments, the filling material 160 may be composed of metallic material. In some embodiments, the filling material 160 may include a material, such as tungsten (W), or the like. However, any suitable material may be utilized.

In some embodiments, the filling material 160 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the filling material 160.

In some embodiments, the cap layer 165 may be composed of nitride. In some embodiments, the cap layer 165 may include a material, such as titanium nitride (TiN), silicon nitride (SixNy), or the like. However, any suitable material may be utilized.

In some embodiments, the cap layer 165 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the cap layer 165.

Figure 3:
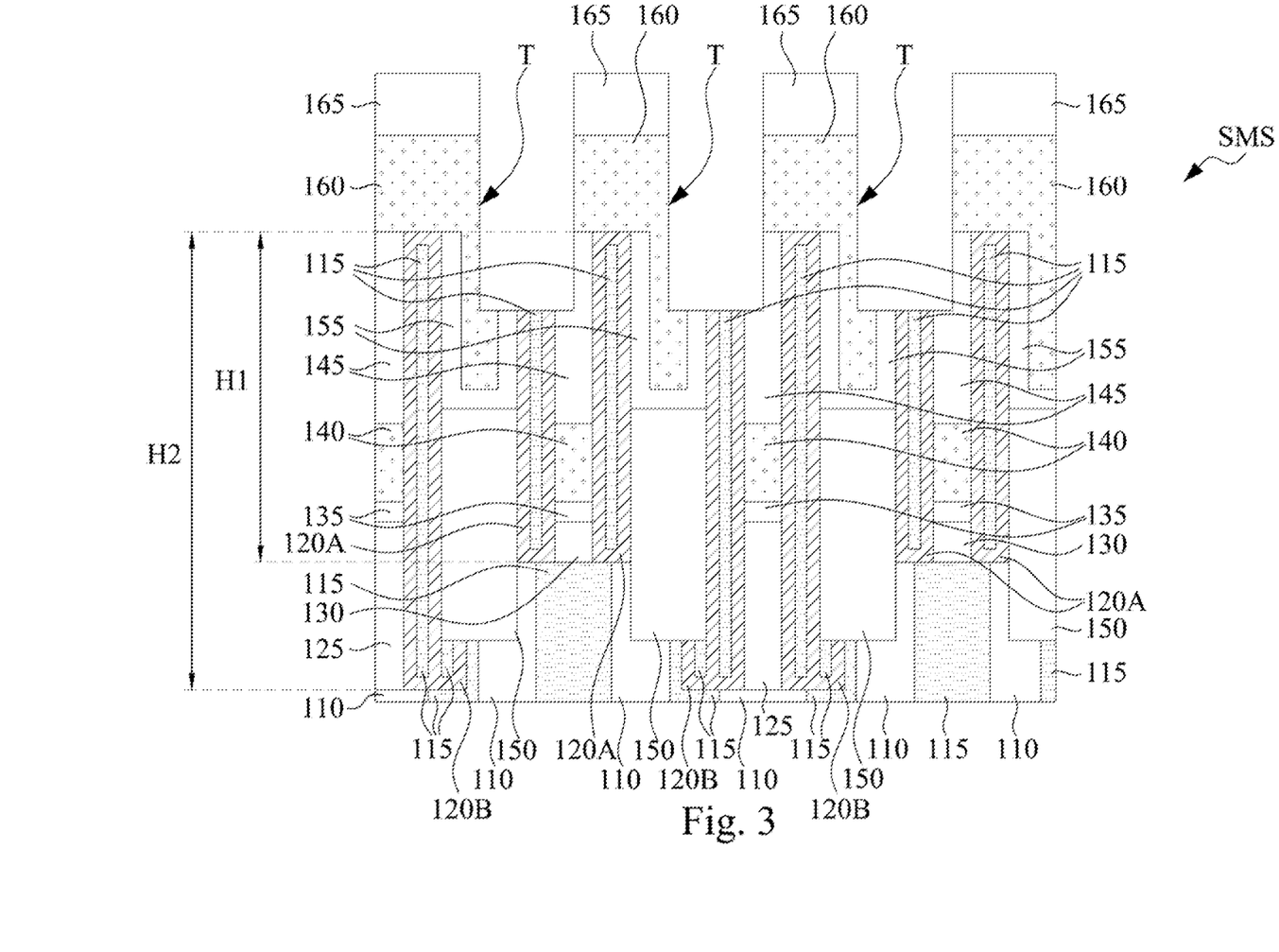
FIG. 3 is a cross-sectional view of an intermediate stage of manufacturing the semiconductor device in accordance with an embodiment of present disclosure.

In step S102, a plurality of trenches T are formed, as shown in FIG. 3.

Reference is made to FIG. 3. FIG. 3 is a cross-sectional view of an intermediate stage of manufacturing the semiconductor device 100 in accordance with an embodiment of present disclosure. As shown in FIG. 3, the trenches T are formed downward from the cap layer 165. More specifically, the trenches T at least runs through the cap layer 165 and the filling material 160, such that the trenches T expose portions of the oxide layer wrapped by the first nitride portions 120A and the second nitride portions 120B.

In some embodiments, a portion of the first nitride portions 120A, a portion of the second nitride portions 120B, and portions of the oxide layer wrapped by the first nitride portions 120A and the second nitride portions 120B are removed as the trenches T are formed, as shown in FIG. 3.

In some embodiments, the trenches T may be formed by any suitable method, for example, wet etching, dry etching, or the like. The present disclosure is not intended to limit the methods of forming the trench T.

In step S103, air gaps AG are formed.

Reference is made to FIG. 4. FIG. 4 is cross-sectional view of an intermediate stage of manufacturing the semiconductor device 100 in accordance with an embodiment of the present disclosure. As shown in FIG. 4, the portions of the oxide layer 115 wrapped by the first nitride portions 120A and the second nitride portions 120B are removed, such that the air gaps AG are formed in situ. Hence, the air gaps AG communicate with the trenches T, as shown in FIG. 4.

In some embodiments, the portions of the oxide layer 115 wrapped by the first nitride portions 120A and the second nitride portions 120B may be removed by using any suitable material, for example, hydrofluoric acid (HF). The present disclosure is not intended to limit the methods of removing the portions of the oxide layer 115 wrapped by the first nitride portions 120A and the second nitride portions 120B.

In step S104, an encapsulating layer 170 is formed on inner sidewalls Ta of the trenches T.

Reference is made to FIG. 5. FIG. 5 is a cross-sectional view of an intermediate stage of manufacturing the semiconductor device 100 in accordance with an embodiment of the present disclosure. As shown in FIG. 5, the encapsulating layer 170 is formed in step S104. Specifically, the encapsulating layer 170 is formed to conform to the inner sidewalls Ta. As shown in FIG. 5, the encapsulating layer 170 is at least deposited on the inner sidewalls Ta of the trenches T. This ensures that the inner sidewalls Ta of the trenches T are lined with the encapsulating layer 170 during the depositing of step S104.

In some embodiments, the encapsulating layer 170 may be deposited by a blanket depositing process. The present disclosure is not intended to limit the methods of depositing the encapsulating layer 170.

In some embodiments, the encapsulating layer 170 is formed, such that the encapsulating layer 170 is not deposited in the air gaps AG.

Figure 6:
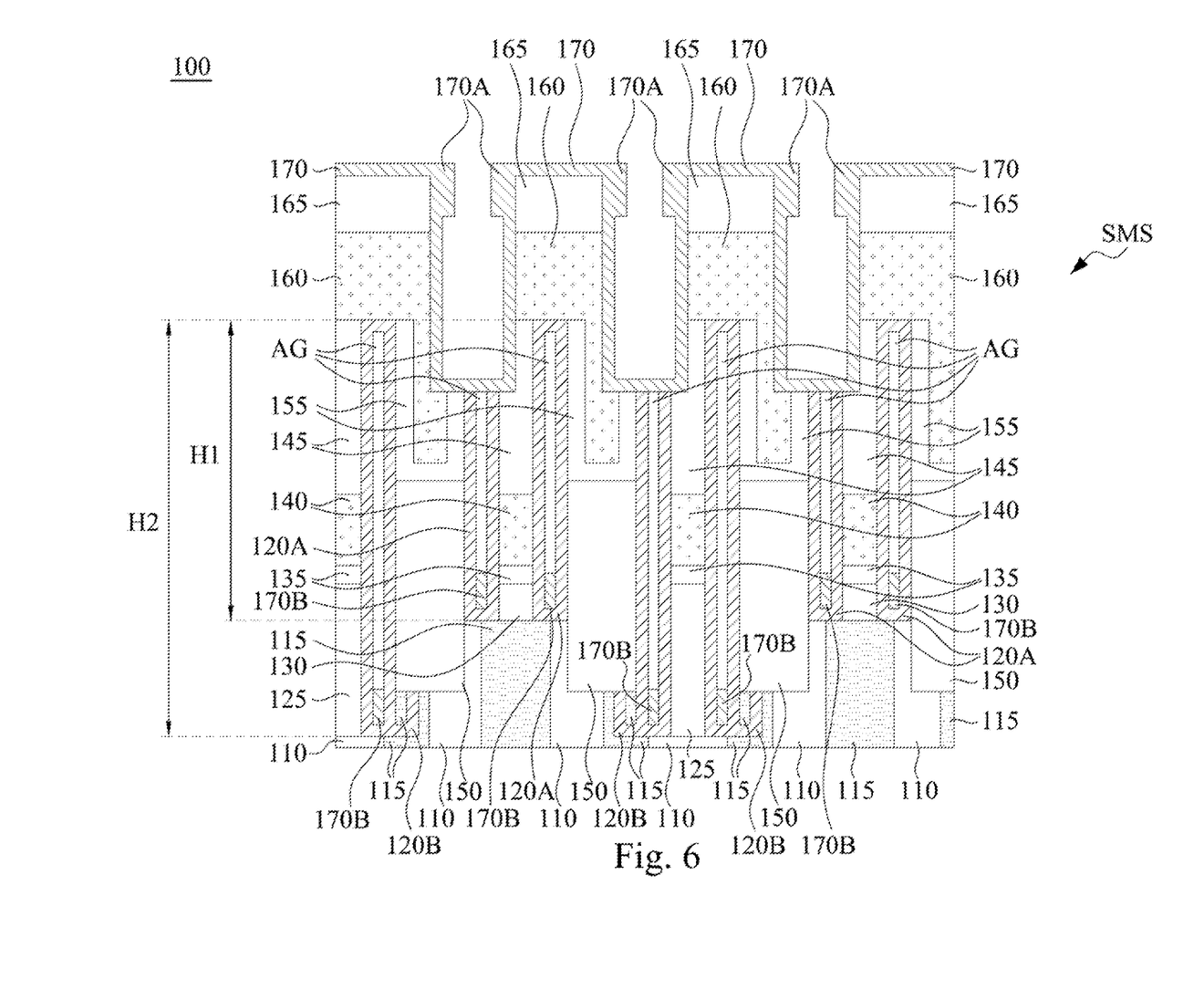
FIG. 6 is a cross-sectional view of an intermediate stage of manufacturing a semiconductor device in accordance with an embodiment of present disclosure.

Reference is made to FIG. 6. FIG. 6 is a cross-sectional view of an intermediate stage of manufacturing the semiconductor device 100 in accordance with an embodiment of present disclosure. As shown in FIG. 6, as the encapsulating layer 170 is persistently deposited, the air gaps AG are encapsulated by the encapsulating layer 170. After step S101 to step S104 are sequentially performed, the semiconductor device 100 is formed.

In some embodiments, the encapsulating layer 170 includes accumulating portions 170A around a top of the trenches T due to using certain type of deposition methods, as shown in FIG. 6. In some other embodiments, the encapsulating layer 170 does not include the accumulating portions 170A around the top of the trenches T. More specifically, step S104 of manufacturing the semiconductor device 100 is performed so that the encapsulating layer 170 partially fills the air gaps AG, as shown in FIG. 6. In other words, the air gaps AG are not fully filled by the encapsulating layer 170.

In some embodiments, the semiconductor device 100 further includes portions 170B of the encapsulating layer 170, and the portions 170B of the encapsulating layer 170 fills in each of the air gaps AG, as shown in FIG. 6. More specifically, the air gaps AG are encapsulated so that the portions 170B of the encapsulating layer 170 does not fully fill the air gaps AG and the accumulating portions 170A of the encapsulating layer 170 does not encapsulate the trenches T as the encapsulating layer 170 is persistently deposited performed in step S104. This ensures that the air gaps AG remained in the semiconductor device 100 and thus beneficial for reducing parasitic capacitance thereof.

In some embodiments, the encapsulating layer 170 is deposited by using a first hydrogen-containing gas and a second hydrogen-containing deposition gas, and the second hydrogen-containing deposition gas is different than the first hydrogen-containing gas. In some embodiments, the first hydrogen-containing gas and the second hydrogen-containing deposition gas are used as precursors to form the encapsulating layer 170. In some embodiments, the sufficient hydrogen generated due to using hydrogen-containing gases during the step S104 terminates the dangling bonds distributed on the surface of the semiconductor device 100, thus provides superior gap-fill capability without extraordinary impurity penetration, thereby improving refresh performance of the semiconductor device 100.

In some embodiments, the first hydrogen-containing gas is silane ($SiH_4$), and the second hydrogen-containing deposition gas is gaseous ammonia ($NH_3$).

In some embodiments, the encapsulating layer 170 is deposited with a deposition rate less than 30 angstroms per second (Å/sec). In some embodiments, the encapsulating layer 170 is preferably deposited with the deposition rate in a range between 5 angstroms per second and 20 angstroms per second. In some embodiments, the deposition rate is substantially 8 angstroms per second. Since the encapsulating layer 170 is deposited with an extremely low deposition rate, the air gaps AG are well encapsulated by the encapsulating layer 170, thereby reducing the parasitic capacitance of the semiconductor device 100.

In some embodiments, the first hydrogen-containing gas has a first flowrate greater than 200 standard cubic centimeters per minute (sccm), and a second hydrogen-containing deposition gas has a second flowrate greater than 500 sccm. In some embodiments, the first flowrate is preferably in a range between 210 sccm and 270 sccm, and the second flowrate is preferably in a range between 2900 sccm and 3500 sccm. In some embodiments, the first flowrate is more preferably to be 240 sccm, and the second flowrate is more preferably to be 3200 sccm. The present disclosure is not limited thereto.

In some embodiments, the encapsulating layer 170 may be composed of nitride. In some embodiments, the encapsulating layer 170 may be fluorine resistant etching stop coating (FRESCO) nitride and thus configured as an etch stop layer. In some embodiments, the encapsulating layer 170 may include silicon nitride ($Si_xN_y$), or the like. However, any suitable material may be utilized.

In some embodiments, the encapsulating layer 170 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the encapsulating layer 170. In a preferred embodiment, the encapsulating layer 170 may be formed by PECVD.

By performing the method M shown in FIG. 1 of the present disclosure, the semiconductor device 100 with better electrical performance may be formed.

Based on the above discussions, it can be seen that the method of manufacturing the semiconductor device of the present disclosure provides superior gap-fill capability without extraordinary impurity penetration. In the method of manufacturing the semiconductor device of the present disclosure, since the encapsulating layer is deposited with an extremely low deposition rate, the air gaps are well encapsulated by the encapsulating layer, thereby reducing the parasitic capacitance of the semiconductor device. In the method of manufacturing the semiconductor device of the present disclosure, since the encapsulating layer is deposited using hydrogen-containing deposition gases, the sufficient hydrogen generated during the process terminates the dangling bonds distributed on the surface of the semiconductor device, thereby improving the electrical performance of the entire semiconductor device.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing a semiconductor device, comprising:
   providing a semiconductor structure, wherein the semiconductor structure comprises alternatively disposed first nitride portions and second nitride portions wrapping portions of an oxide layer, a dielectric layer disposed between one of the first nitride portions and one of the second nitride portions, a top nitride surrounded by the one of the first nitride portions or the one of the second nitride portions, a filling material disposed over the dielectric layer, the first nitride portions, the second nitride portions, and the top nitride, and a cap layer disposed on the filling material;

forming a plurality of trenches to expose the portions of the oxide layer wrapped by the first nitride portions and the second nitride portions, wherein the trenches at least run through the filling material and the cap layer;

removing the portions of the oxide layer wrapped by the first nitride portions and the second nitride portions to form air gaps; and conformally forming an encapsulating layer on inner sidewalls of the trenches to encapsulate the air gaps, wherein the encapsulating layer comprises accumulating portions around a top of the trenches, and wherein the encapsulating layer is formed by using a first hydrogen-containing gas and a second hydrogen-containing deposition gas different from the first hydrogen-containing gas, and wherein the encapsulating layer partially fills the air gaps.

2. The method of claim 1, wherein the first hydrogen-containing gas is silane ($SiH_4$), and the second hydrogen-containing deposition gas is gaseous ammonia ($NH_3$).

3. The method of claim 1, wherein conformally forming the encapsulating layer on the inner sidewalls of the trenches is performed by supplying the first hydrogen-containing gas with a first flowrate greater than 200 standard cubic centimeters per minute (sccm), and supplying the second hydrogen-containing deposition gas with a second flowrate greater than 500 sccm.

4. The method of claim 3, wherein the first flowrate is in a range between 210 sccm and 270 sccm, and the second flowrate is in a range between 2900 sccm and 3500 sccm.

5. The method of claim 1, wherein conformally forming the encapsulating layer on the inner sidewalls of the trenches is performed with a deposition rate less than 30 angstroms per second (Å/sec).

6. The method of claim 5, wherein the deposition rate is in a range between 5 angstroms per second and 20 angstroms per second.

7. The method of claim 1, wherein conformally forming the encapsulating layer on the inner sidewalls of the trenches is performed such that the air gaps of the first nitride portions and the air gaps of the second nitride portions are encapsulated.

8. The method of claim 1, wherein forming the trenches is performed such that a portion of the first nitride portions and a portion of the second nitride portions are removed.

9. The method of claim 1, wherein forming the trenches is performed such that the air gaps of the first nitride portions and the air gaps of the second nitride portions respectively communicate with the trenches.

10. The method of claim 1, wherein removing the portions of the oxide layer wrapped by the first nitride portions and the second nitride portions is performed by using hydrofluoric acid.

* * * * *